United States Patent
Engbrecht et al.

(10) Patent No.: US 12,494,599 B2
(45) Date of Patent: Dec. 9, 2025

(54) SILICON FLEXIBLE CONNECTORS

(71) Applicants: Edward R. Engbrecht, Odenton, MD (US); Jeffrey David Hartman, Severn, MD (US); Justin C. Hackley, Catonsville, MD (US)

(72) Inventors: Edward R. Engbrecht, Odenton, MD (US); Jeffrey David Hartman, Severn, MD (US); Justin C. Hackley, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 492 days.

(21) Appl. No.: 18/068,550

(22) Filed: Dec. 20, 2022

(65) Prior Publication Data

US 2024/0204435 A1    Jun. 20, 2024

(51) Int. Cl.
*H01R 12/77* (2011.01)
*H01R 43/16* (2006.01)

(52) U.S. Cl.
CPC ............. *H01R 12/77* (2013.01); *H01R 43/16* (2013.01)

(58) Field of Classification Search
CPC ................................ H01R 12/77; H01R 43/16
USPC ........................................................ 439/502
See application file for complete search history.

(56) References Cited

U.S. PATENT DOCUMENTS

| | | | | |
|---|---|---|---|---|
| 2,973,502 A | * | 2/1961 | Tally | H01B 7/0018 439/495 |
| 3,079,458 A | * | 2/1963 | Hedstrom | H01R 12/77 439/492 |
| 3,168,617 A | * | 2/1965 | Richter | H01B 7/0838 439/85 |
| 3,173,991 A | * | 3/1965 | Breakfield, Sr. | H05K 3/281 428/140 |
| 3,239,916 A | * | 3/1966 | Love | H01B 7/38 439/492 |
| 3,547,718 A | * | 12/1970 | Gordon | H01B 7/0838 174/117 FF |
| 4,715,928 A | * | 12/1987 | Hamby | H05K 3/4691 156/150 |
| 4,913,662 A | * | 4/1990 | Noy | H05K 1/118 174/268 |

(Continued)

FOREIGN PATENT DOCUMENTS

| | | | |
|---|---|---|---|
| CN | 106653178 A | * | 5/2017 |
| CN | 210073373 U | * | 2/2020 |

(Continued)

*Primary Examiner* — Peter G Leigh
(74) *Attorney, Agent, or Firm* — Tarolli, Sundheim, Covell & Tummino LLP

(57) ABSTRACT

An electrical connection device is provided that includes a first electrical connector having first electrical contacts formed therein and a second electrical connector having second electrical contacts formed therein. A flexible silicon connector section connects the first electrical connector and the second electrical connector. The connector section includes flexible strands separated by slots, where the flexible strands are flexible in directions orthogonal to a longitudinal direction of the connector section. The flexible strands include metal traces deposited therein to provide an electrical connection between the first electrical connector and the second electrical connector.

20 Claims, 14 Drawing Sheets

(56) References Cited

U.S. PATENT DOCUMENTS

| | | | | |
|---|---|---|---|---|
| 5,854,534 | A | * | 12/1998 | Beilin ............... H01L 23/49827 257/E23.067 |
| 6,040,624 | A | * | 3/2000 | Chambers .............. H05K 1/147 257/668 |
| 6,721,189 | B1 | * | 4/2004 | Haba ...................... H05K 1/147 439/74 |
| 7,012,812 | B2 | * | 3/2006 | Haba ...................... H01R 12/52 439/74 |
| 8,118,611 | B2 | * | 2/2012 | Jeon ...................... H01R 31/08 439/511 |
| 8,178,789 | B2 | * | 5/2012 | Takahashi ............ H05K 3/4691 361/760 |
| 10,681,812 | B2 | * | 6/2020 | Hartman .................. H05K 3/10 |
| 2002/0081894 | A1 | * | 6/2002 | Fuerst .................. H01R 12/613 439/492 |
| 2004/0053519 | A1 | * | 3/2004 | Li ........................ H01R 12/714 439/63 |
| 2004/0231878 | A1 | * | 11/2004 | Higashida .............. H05K 3/361 174/541 |

FOREIGN PATENT DOCUMENTS

| | | | | |
|---|---|---|---|---|
| EP | 0534290 | A2 | * | 3/1993 ........... H05K 1/0278 |
| JP | 2006339088 | A | * | 12/2006 ........... H01R 12/592 |

* cited by examiner

SECTION A-A

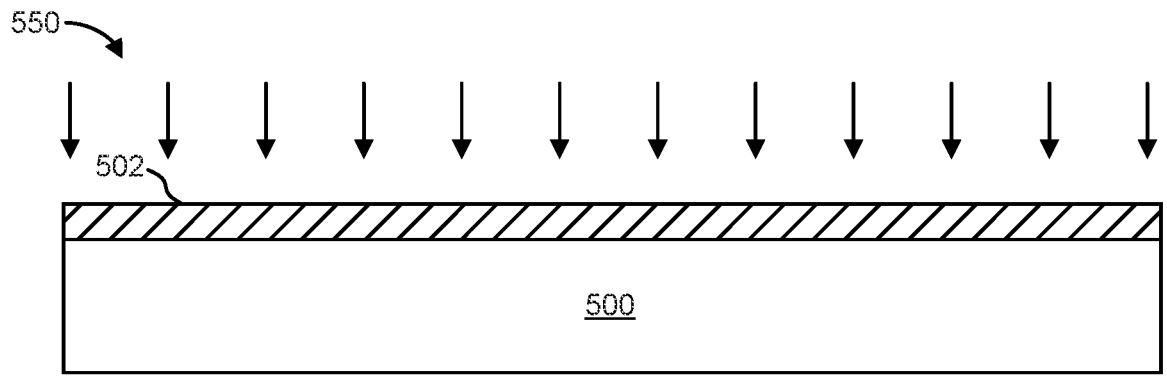
FIG. 5A
FIG. 5B
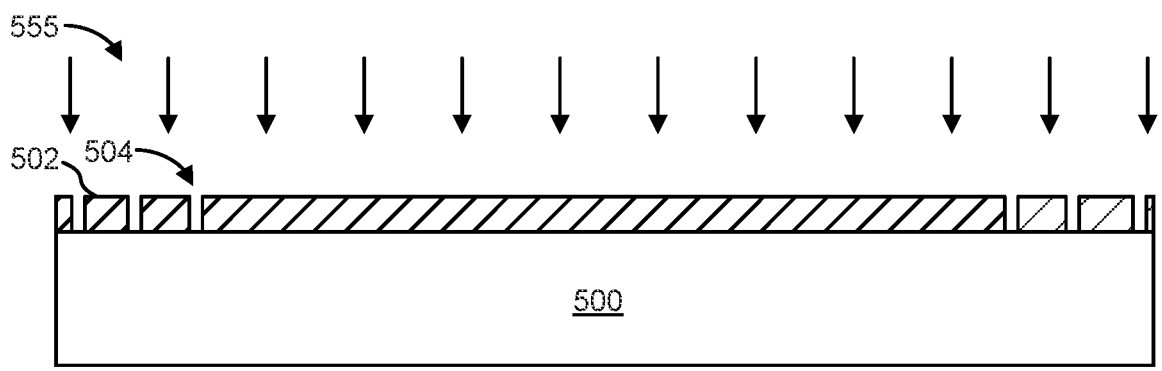
FIG. 5C
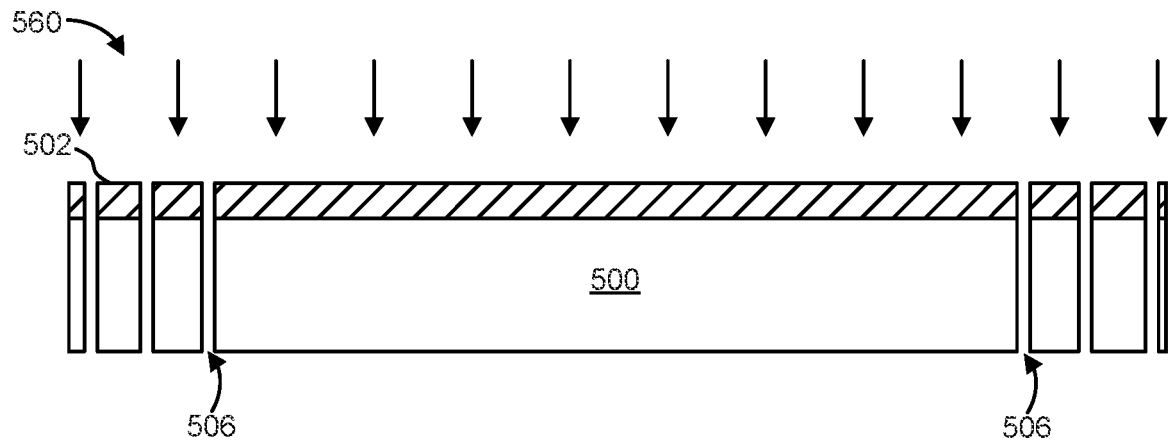
FIG. 5D

SECTION D-D

SECTION D-D

SILICON FLEXIBLE CONNECTORS

GOVERNMENT INTEREST

The invention was made under Government Contract. Therefore, the US Government has rights to the invention as specified in that contract.

TECHNICAL FIELD

The present invention relates generally to connectors, and more particularly to silicon flexible connectors.

BACKGROUND

In many large electronic applications it is desirable to connect electrical devices together for adding functionality and/or for increasing capacity. These electrical devices are typically connected to one another through one or more electrical connectors. An electrical connector is an electro-mechanical device used to join electrical conductors and create an electrical circuit between electrical devices. Thousands of configurations of connectors are manufactured for power, data, and audiovisual applications. Electrical connectors essentially consist of two classes of materials: conductors and insulators. Properties important to conductor materials are contact resistance, conductivity, mechanical strength, formability, and resilience. Insulators must have a high electrical resistance, withstand high temperatures, and be easy to manufacture for a precise fit.

SUMMARY

In one example, an electrical connection device is provided and includes a first electrical connector having first electrical contacts formed therein and a second electrical connector having second electrical contacts formed therein. A flexible silicon connector section connects the first electrical connector and the second electrical connector. The connector section includes flexible strands separated by slots, where the flexible strands are flexible in directions orthogonal to a longitudinal direction of the connector section. The flexible strands include metal traces deposited therein to provide an electrical connection between the first electrical connector and the second electrical connector.

In yet another example, a method of fabricating an electrical connection assembly includes providing a single piece of silicon material having metal traces disposed therein. An electrically conductive material is deposited in vias formed in each end of the single piece of silicon material via a first etching process to form contacts that connect with the metal traces. Slots are formed in a connector section of the single piece of silicon material via a second etching process, where the slots are defined between strands of the connector section. A backside of an exposed portion of the connector section of the single piece of silicon material is etched via a third etching process to form an opening such that the slots extend through the connector section to thereby release the strands.

In still yet another example, a method of fabricating an electrical connection assembly includes providing a single piece of silicon material having metal traces disposed therein. An electrically conductive material is deposited in vias formed in each end of the single piece of silicon material via a first etching process to form contacts that connect with the metal traces. Slots are formed in a portion of a connector section of the single piece of silicon material via a second etching process, where the slots are defined between strands of the connector section. Channels and integrated strands are formed in a support structure area of the connector section via a third etching process, where the channels being formed between the integrated strands. A backside of an exposed portion of the connector section of the single piece of silicon material is etched via a fourth etching process to form an opening such that the slots extend through the connector section to thereby release the strands and to form a support structure. The support structure is comprised of a base and the integrated strands attached to the base in the support structure area of the connector section.

DETAILED DESCRIPTION

Silicon electrical connection devices are comprised of a pair of silicon electrical connectors comprised of silicon blocks and a connector section comprised of a flexible thin silicon section connecting the pair of electrical connectors. The connector section is comprised of a single uniform flexible sheet of thin material (e.g., silicon). The thin (e.g., 10-50 microns thick) silicon section is flexible in the z-direction, but flexibility of the thin silicon section is inhibited in the y-direction. Thus, any twisting or movement in the y-direction could result in the thin silicon section shearing in either the x- or y-direction. In addition, in order to compensate for the non-uniform orientation (e.g., varied thicknesses, rotated with respect to each other, on different planes, etc.) between electronic components that the silicon electrical connector connects, the thin silicon section must be able to flex in both the y- and z-directions without shearing.

Disclosed herein is an improved integrated electrical connection device comprised of a pair of electrical connectors and a connector section comprised of flexible strands connecting the pair of electrical connectors, where the connector section has the capabilities of flexing in both the y-, and z-directions. Specifically, the connector section includes slots defined in the single uniform flexible sheet of thin material to create thin narrow flexible strands. Thus, since the surface area and the amount of material of the connector section in the y-direction of is reduced, the flexibility of the connector section in both the y- and z-directions increases. The thin narrow flexible strands can have an aspect ratio of approximately 1:1 (i.e., the thickness (t) and the width (w) of each flexible strand are approximately the same) or can have a thickness (t) that is greater or less than the width (w) without sacrificing flexibility. In addition, the flexible strands can include metal traces for electrical conductivity. The flexible strands can include a thin support structure (layer) or crossbar and/or a flexible polymer dielectric coating to increase the mechanical strength of the electrical connection device without sacrificing flexibility.

Figure 1A:
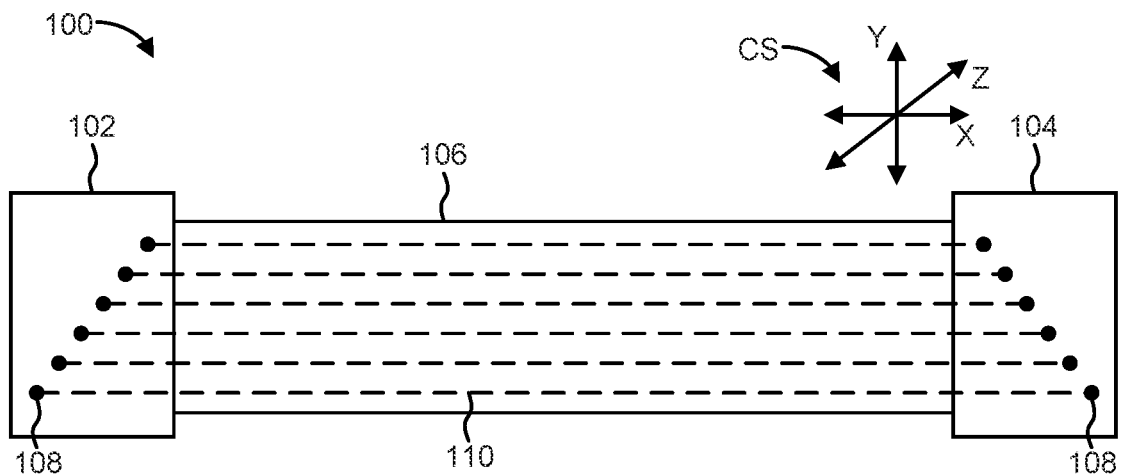
FIGS. 1A and 1B are a plan and side view of an example connection device.
Figure 1B:
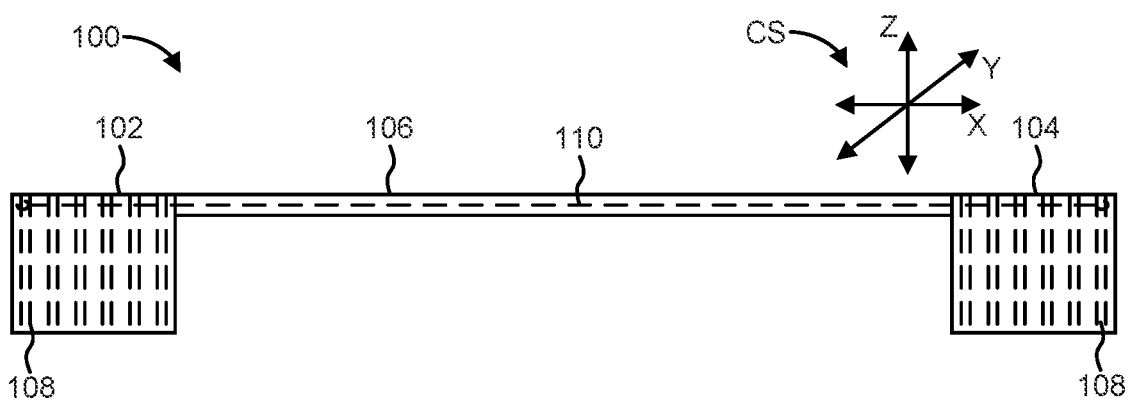

FIGS. 1A and 1B are a plan and side view respectively of an example integrated electrical connection device (hereinafter "connection device") 100. The connection device 100 is made from a flexible material (e.g., silicon). The connection device 100 includes first and second electrical connectors 102, 104 and a connector section 106. The connector section 106 connects the first and second electrical connectors 102, 104 to each other. Electrical contacts 108 are arranged in the first and second electrical connectors 102, 104 to provide an electrical connection to electronic components. The connector section 106 includes metal traces 110 that are connected to the electrical contacts 108 in the first and second electrical connectors 102, 104 to electrically connect the first and second electrical connectors 102, 104 to each other.

In the example illustrated in FIGS. 1A and 1B, the connector section 106 is comprised of a solid uniform sheet of a flexible material, (e.g., silicon) that can flex in the z-direction as indicated by the coordinate system (CS). The configuration of the solid uniform sheet of the connector section 106, however, inhibits flexing in the y-direction due to the amount of surface area and actual amount of material of the solid uniform sheet in y-direction. This configuration creates risks with handling and use when connecting electronic components together that have different orientations (e.g., varied thicknesses, rotated with respect to each other, on different planes, etc.). Thus, if the connection device 100 is twisted in a direction that does not facilitate flexibility, there is a risk that the connection device 100, and more specifically, the connector section 106 will shear in the x- or y-direction.

Figure 2A:
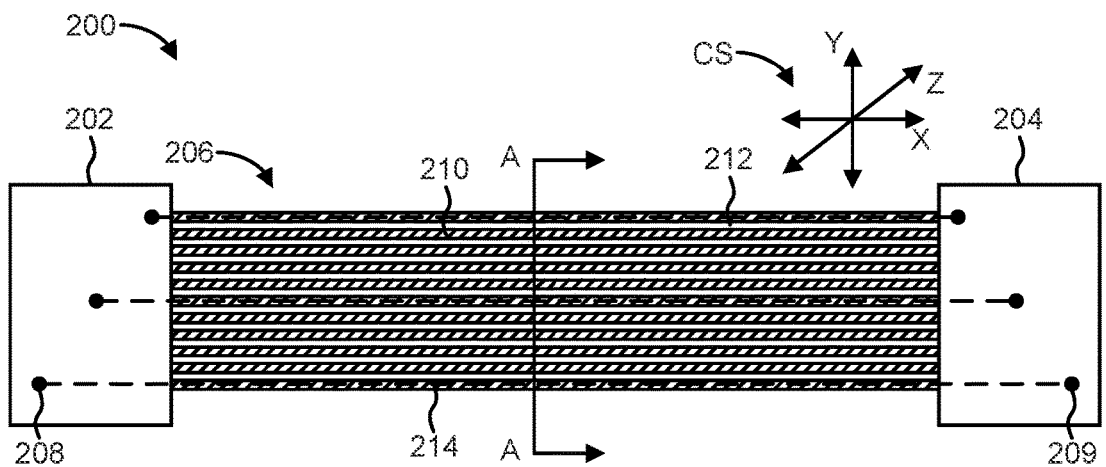
FIGS. 2A and 2B are a plan and side view of another example connection device.
Figure 2B:
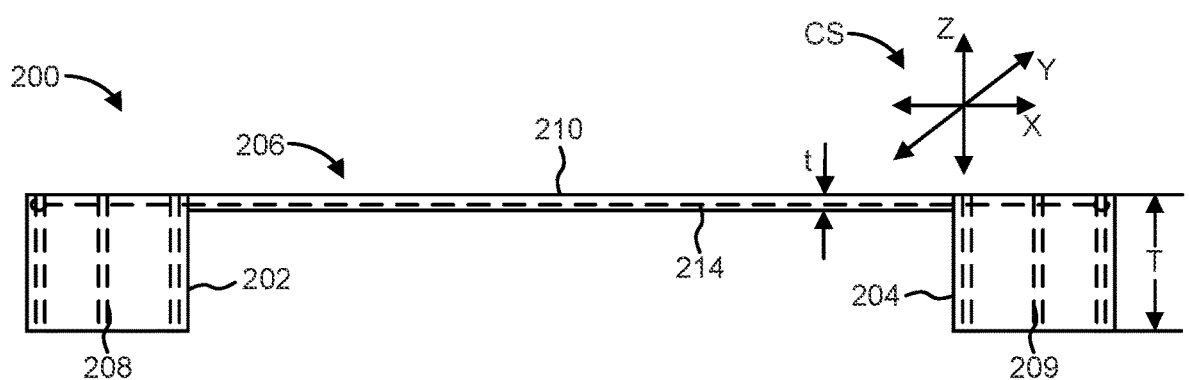
Figure 2C:
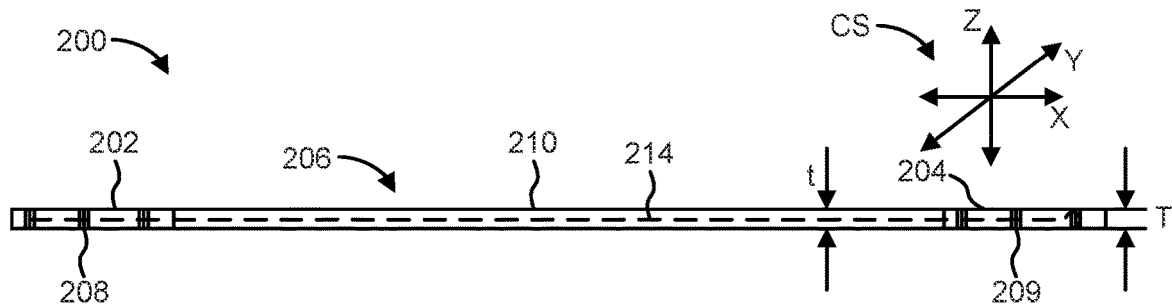
FIG. 2C is a side view of a modified connection assembly of the connection device FIG. 2A.

FIGS. 2A, 2B, and 2C are a plan view and two side views respectively of another example of a flexible electrical connection device (hereinafter "connection device") 200. The connection device 200 includes first and second electrical connectors 202, 204 and a connector section 206. The connection device 200, including the first and second electrical connectors 202, 204 and the connector section 206, can be made from a flexible material (e.g., silicon, sapphire, quartz, polyimide).

First and second electrical contacts 208, 209 are arranged in both the first and second electrical connectors 202, 204 respectively. In one example, as illustrated in FIG. 2B, the first and second electrical contacts 208, 209 can extend to a bottom surface of the each of the first and second electrical connectors 202, 204. In another example, the electrical contacts 208, 209 can extend to a top surface of each of the first and second electrical connectors 202, 204, as described in U.S. Pat. No. 10,681,812 the entirety of which is herein incorporated by reference. The first and second electrical contacts 208, 209 electrically connect the first and second electrical connectors 202, 204 to electronic components.

The connector section 206 is comprised of multiple flexible strands 210 of the flexible material (e.g., silicon). The flexible strands 210 have a thickness of approximately 10-50 microns that connect the first and second electrical connectors 202, 204 to each other. The flexible strands 210 are spaced apart by slots 212 (see FIGS. 2A and 2D) at a predetermined distance (e.g., 1-100 microns) to facilitate flexibility in directions that are orthogonal (y- and z-directions) to a longitudinal direction (x-direction) indicated by the coordinate system (CS) in FIGS. 2A-2D without sacrificing the mechanical integrity of the connection device 200. As will be described in more detail below, the slots 212 are defined in a solid uniform sheet of the flexible material (e.g., silicon) to form the flexible strands 210.

Metal traces 214 are arranged in or on one or more of the flexible strands 210. For example, the metal traces 214 can be arranged in or on one flexible strand 210, two flexible strands 210, three flexible strands 210 (as illustrated in the figures), etc. up to all of the flexible strands 210. The metal traces 214 are connected to the first and second electrical contacts 208, 209 in both the first and second electrical connectors 202, 204 respectively. Thus, the metal traces 214 electrically connect the first and second electrical connectors 202, 204 to each other. As a result, an electrical connection is achieved between an electronic component coupled to the first electrical connector 202 and an electronic component coupled to the second electrical connector 204.

Figure 2D:
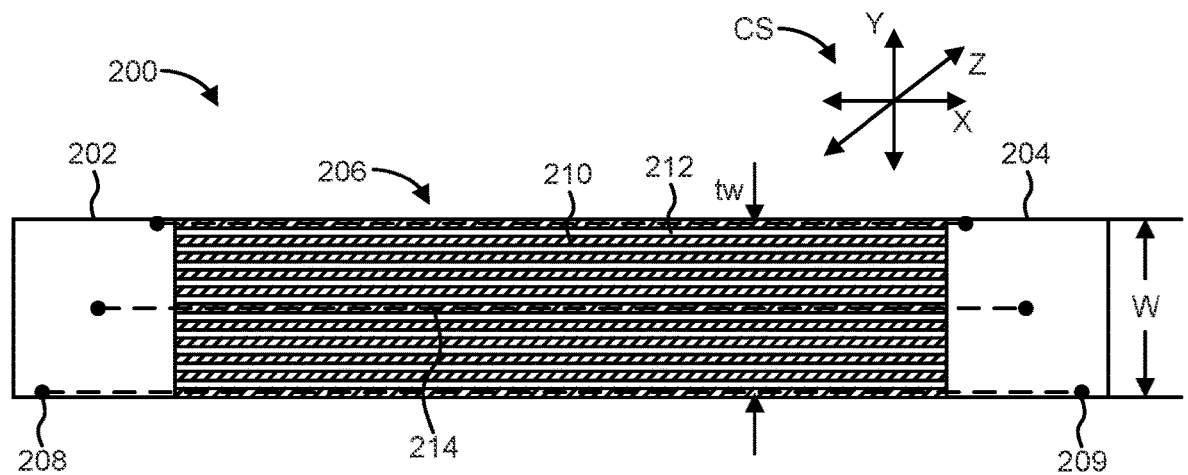
FIG. 2D is a plan view of a modified connection assembly of the connection device of FIG. 2A.

In one example, a thickness (T) of the first and second electrical connectors 202, 204 can have a thickness that is greater than a thickness (t) of the connector section 206, as illustrated in FIG. 2B. In another example, the thickness (T) of the first and second electrical connectors 202, 204 can have a thickness that is approximately the same than the thickness (t) of the connector section 206, as illustrated in FIG. 2C. In still another example, a width (W) of the first and second electrical connectors 202, 204 can be approximately the same as a total width (tw) of the connector section 206, as illustrated in FIG. 2D. Still referring to FIG. 2D, the total width (tw) is defined as a sum of a width (w) of each flexible strand 210, see FIG. 2E, plus a sum of a width of each slot 212 defined between the flexible strands 210.

Figure 2E:
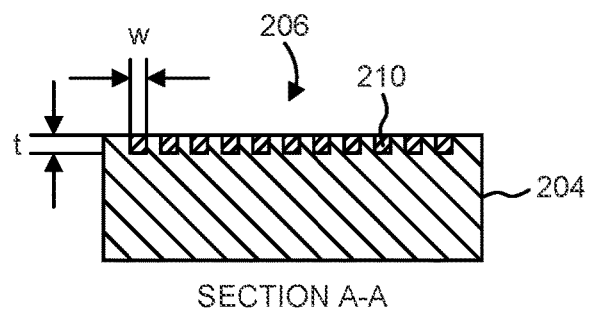
FIG. 2E is a cross-sectional view of a connector section of the connection device of FIG. 2A.

FIG. 2E is a cross-sectional view taken along line A-A of the connection device 200 illustrated in FIG. 2A. The metal traces 214 have been omitted from FIG. 2E for clarity. As illustrated in FIG. 2E, each flexible strand 210 has a width (w) and a thickness (t). In one example, an aspect ratio of each flexible strand can be approximately 1:1. In other words, the width (w) and the thickness (t) of each flexible strand 210 can be approximately the same. For example, both the width (w) and the thickness (t) can be approximately 20 microns. In other examples, the width (w) of each flexible strand 210 can be greater or less than the thickness (t).

In the examples illustrated in FIGS. 2A-2D, since the amount of surface area and the actual amount of material of the connector section 206 in the y-direction is reduced, the flexibility of the connector section in both the y- and z-directions increases. Specifically, forming slots in the connector section 206 reduces the amount of material in the connector section 206 thereby allowing the connector section to flex in both the y- and z-directions.

Figure 3A:
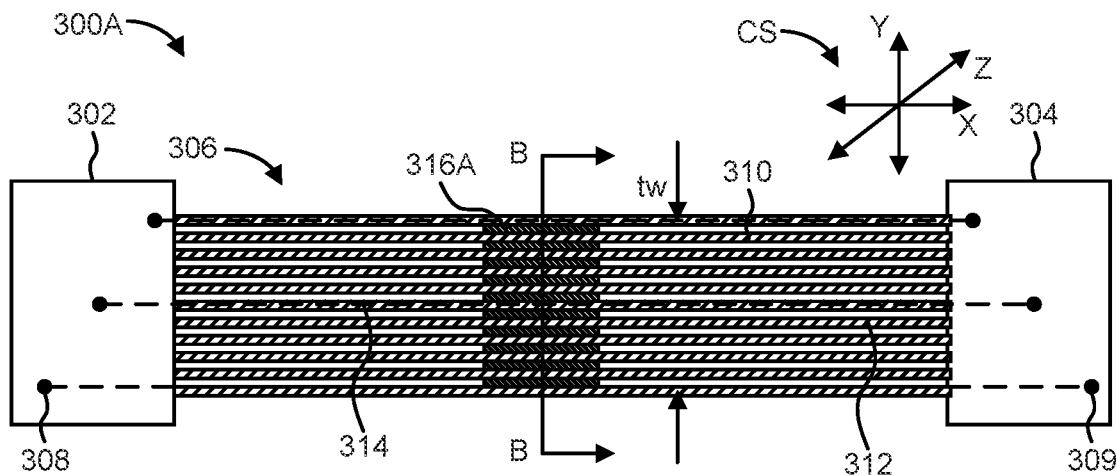
FIG. 3A is a plan view of another example of a connection device.
Figure 3B:
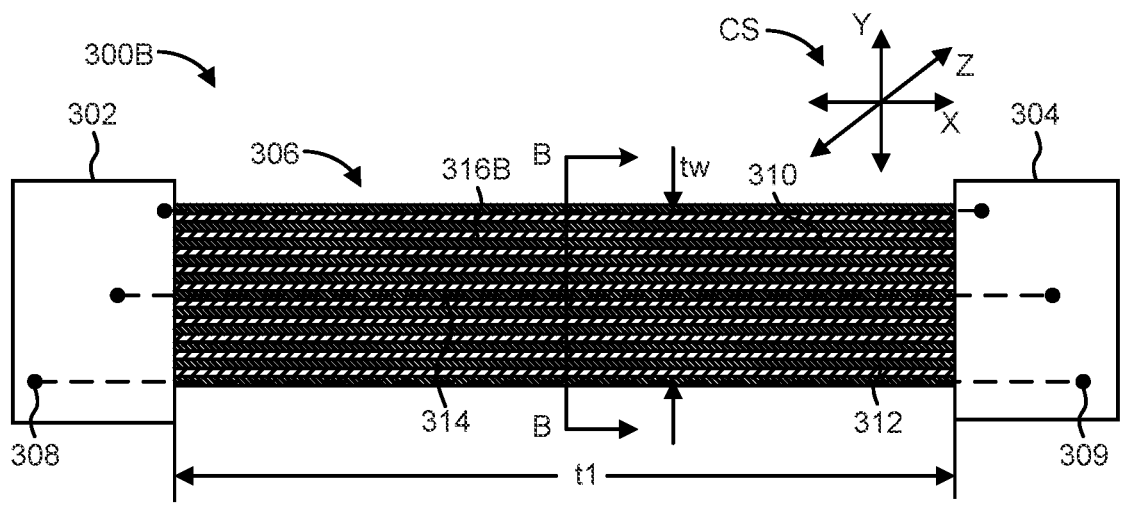
FIG. 3B is a plan view of another example of a connection device.

FIGS. 3A and 3B are plan views of other examples of a flexible electrical connection device (hereinafter "connection device") 300A, 300B. The connection devices 300A, 300B include first and second electrical connectors 302, 304 and a connector section 306. The connection devices including the first and second electrical connectors 302, 304 and the connector section 306 can be made from flexible material (e.g., silicon, sapphire, quartz, polyimide). In one example, the electrical devices 300A, 300B can be formed from a single piece of the flexible material such that the first and second electrical connectors 302, 304 and the connector section 306 are an integrated unit. In another example, the first and second electrical connectors 302, 304 and the connector section 306 can be formed from individual pieces of the flexible material that are then bonded together to form the electrical connection devices 300A, 300B.

First and second electrical contacts 308, 309 are arranged in both the first and second electrical connectors 302, 304 respectively. The electrical contacts 308, 309 electrically connect the first and second electrical connectors 302, 304 to electronic components.

The connector section 306 is comprised of multiple flexible strands 310 of the flexible material (e.g., silicon). The flexible strands 310 have a thickness of approximately 10-50 microns that connect the first and second electrical connectors 302, 304 to each other. The flexible strands 310 are spaced apart by slots 312 at a predetermined distance (e.g., 1-100 microns) to facilitate flexibility in directions that are orthogonal (y- and z-directions) to a longitudinal direction (x-direction) indicated by the coordinate system (CS) in FIGS. 3A and 3B without sacrificing the mechanical integrity of the connection device 300A, 300B. As will be described in more detail below, the slots 312 are defined in a solid uniform sheet of the flexible material (e.g., silicon) to form the flexible strands 310.

Metal traces 314 are arranged in or on one or more of the flexible strands 310. The metal traces 314 are connected to the first and second electrical contacts 308, 309 in both the first and second electrical connectors 302, 304 respectively. Thus, the metal traces 314 electrically connect the first and second electrical connectors 302, 304 to each other. As a result, an electrical connection is achieved between an electronic component coupled to the first electrical connector 302 and an electronic component coupled to the second electrical connector 304.

Figure 3C:
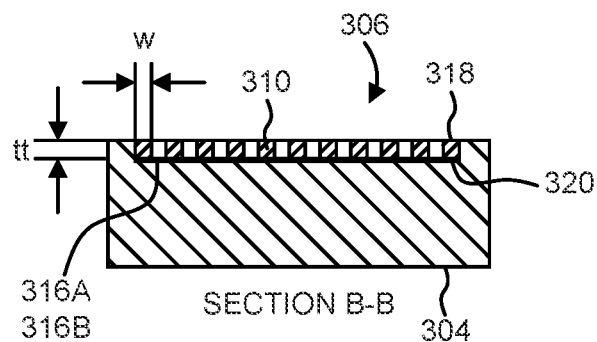
FIG. 3C is a cross-sectional view of a connector section of the connection device of FIGS. 3A and 3B.

FIG. 3C is a cross-sectional view taken along line B-B of the connection devices 300A, 300B illustrated in FIGS. 3A and 3B. The metal traces 314 have been omitted from FIG. 3C for clarity. As illustrated in FIG. 3C, in the example connection devices 300A, 300B illustrated in FIGS. 3A and 3B, the connector section 306 further includes a support structure or layer 316A, 316B. The support structure 316A, 316B, is comprised of an ultrathin layer (e.g., 1-10 microns) of the flexible material disposed on either a first (top) surface 318 or a second (bottom) surface 320 of a portion or all of the flexible strands 310. The support structure 316A, 316B provides additional rigidity and mechanical support for handling without sacrificing flexibility in the y- and z-direction.

The support structure 316A, 316B can be made from the same material as the flexible strands 310 (e.g., silicon). Specifically, the support structure 316A, 316B is formed from the same uniform sheet of flexible material (e.g., silicon) as the flexible strands 310. Thus, a portion or all of the flexible strands 310 are integrated with the support structure 316A, 316B. As will be explained below, channels are partially etched (e.g., deep reactive ion etching) into the uniform sheet of flexible material to form the ultrathin layer of the support structure 316A, 316B. Thus, a thickness of the support structure 316A, 316B plus the thickness of the flexible strands 310 in an area or region of the support structure 316A, 316B can have a total thickness (tt) that is approximately the same as the width (w) of the flexible strands 310. For example, if the thickness of the uniform sheet is 20 microns, the slots will be partially etched such that the remaining thickness of the support structure is 2-5 microns. As a result, the thickness of the flexible strands 310 in the region of the support structure will be 15-18 microns thereby totaling 20 microns.

The support structure or layer 316A illustrated in FIG. 3A is a partial support structure that is disposed across a total width (tw) in the y-direction of the flexible strands 310, but is only disposed across a portion of the length in the x-direction of the flexible strands 310. Referring to FIG. 3B, the total width (tw) is defined as a sum of a width (w) of each flexible strand 310, see FIG. 3C, plus a sum of a width of each slot 312 defined between the flexible strands 310. The connection device 300A can include one (as shown in FIG. 3B) or more partial support structures 316A in one or more regions of the connector section 306. The partial support structure 316A can be centralized between the first and second electrical connectors 302, 304 (as shown in FIG. 3A) or can be disposed at any location between the first and second electrical connectors 302, 304. The support structure or layer 316B illustrated in FIG. 3B is a full support region that is disposed across the total width (tw) in the y-direction and across the total length (tl) in the x-direction of the flexible strands 310.

In the examples illustrated in FIGS. 3A-3B, since the amount of surface area and the actual amount of material of the connector section 306 in the y-direction is reduced, the flexibility of the connector section in both the y- and z-directions increases. Specifically, forming slots in the connector section 306 reduces the amount of material in the connector section 306 thereby allowing the connector section to flex in both the y- and z-directions.

Figure 4A:
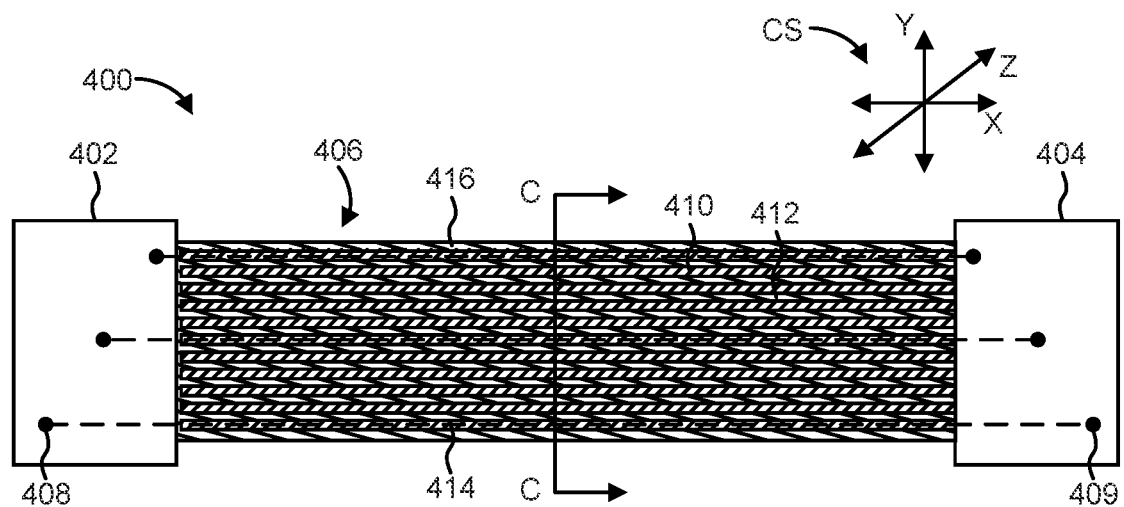
FIG. 4A is a plan view of another example of a connection device.

FIG. 4A is a plan view of another example of a flexible electrical connection device (hereinafter "connection device") 400. The connection device 400 includes first and second electrical connectors 402, 404 and a connector section 406. The connection device 400, including the first and second electrical connectors 402, 404 can be made from a flexible material (e.g., silicon, sapphire, quartz, polyimide). In one example, the electrical device 400 can be formed from a single piece of the flexible material such that the first and second electrical connectors 402, 404 and the connector section 406 are an integrated unit. In another example, the first and second electrical connectors 402, 404 and the connector section 406 can be formed from individual pieces of the flexible material and are bonded together to form the electrical connection device 400.

First and second electrical contacts 408, 409 are arranged in both the first and second electrical connectors 402, 404 respectively. The first and second electrical contacts 408, 409 electrically connect the first and second electrical connectors 402, 404 to electronic components.

The connector section 406 is comprised of multiple flexible strands 410 of the flexible material (e.g., silicon). The flexible strands 410 have a thickness of approximately 10-50 that connect the first and second electrical connectors 402, 404 to each other. The flexible strands 410 are spaced apart by slots 412 at a predetermined distance (e.g., 1-100 microns) to facilitate flexibility in directions that are orthogonal (y- and z-directions) to a longitudinal direction (x-direction) indicated by the coordinate system (CS) in FIG. 4A without sacrificing the mechanical integrity of the connection device 400. As will be described in more detail below, the slots 412 are defined in a solid uniform sheet of the flexible material to form the flexible strands 410. Metal traces 414 are arranged in or on one or more of the flexible strands 410. The metal traces 414 are connected to the first and second electrical contacts 408, 409 in both the first and second electrical connectors 402, 404 respectively. Thus, the metal traces 414 electrically connect the first and second electrical connectors 402, 404 to each other. As a result, an electrical connection is achieved between an electronic component coupled to the first electrical connector 402 and an electronic component coupled to the second electrical connector 404.

Figure 4B:
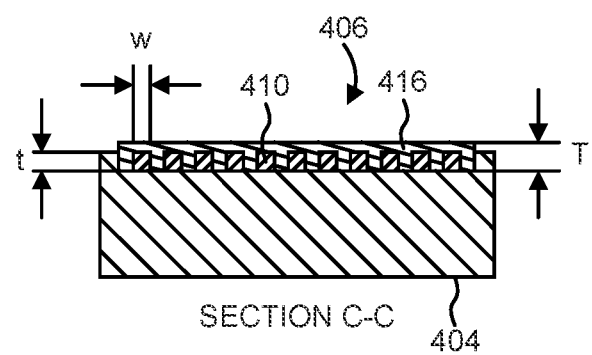
FIG. 4B is a cross-sectional view of a connector section of the connection device of FIG. 4A.

FIG. 4B is a cross-sectional view taken along line C-C of the connection device 400 illustrated in FIG. 4A. The metal traces 414 have been omitted from FIG. 4B for clarity. As illustrated in FIG. 4A, each flexible strand 410 has a width (w) and a thickness (t). In one example, an aspect ratio of each flexible strand 410 can be approximately 1:1. In other words, the width (w) and the thickness (t) of each flexible strand 410 can be approximately the same. For example, both the width (w) and the thickness (t) can be approximately 20 microns. In other examples, the width (w) of each flexible strand 410 can be greater or less than the thickness (t).

As illustrated in FIGS. 4A and 4B, the connector section 406 further includes a flexible polymer dielectric coating (hereinafter "coating") 416. The coating 416 may be applied over the entire connector section 406, as illustrated in FIG. 4A or may be applied in selected regions of the connector section 406. As shown in FIG. 4B, the coating 416 is deposited in the slots 412 defined between the flexible strands 410 and covers flexible strands 410 such that the coating 416 has a thickness (T) greater than the thickness (t) of the flexible strands 410. In another example, the thickness (T) of the coating 416 and the thickness (t) of the flexible strands 410 could be approximately the same. The polymer dielectric coating 416 provides support for handling without sacrificing flexibility in both the y- and z-directions. In addition, the connection device 400 including the coating 416 may also include the support structure 316A, 316B illustrated in FIGS. 3A-3C.

In the example illustrated in FIG. 4A, since the amount of surface area and the actual amount of material of the connector section 406 in the y-direction is reduced, the flexibility of the connector section in both the y- and z-directions increases. Specifically, forming slots in the connector section 406 reduces the amount of material in the connector section 406 thereby allowing the connector section to flex in both the y- and z-directions.

Figure 5E:
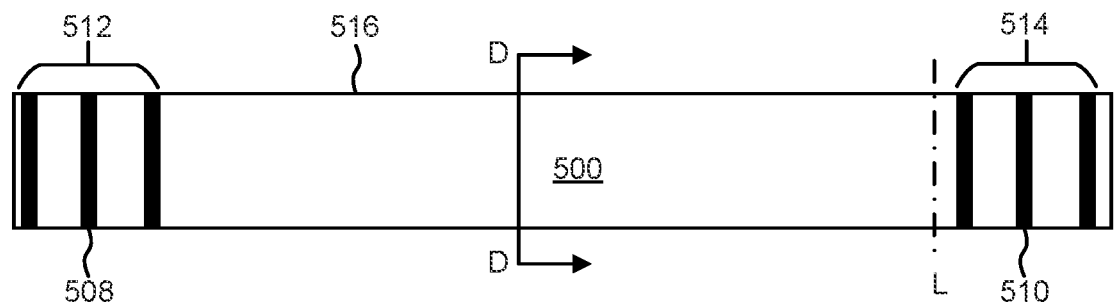
FIGS. 5A-5N is an example fabrication process of the electrical connection device of FIGS. 2A and 4A.
Figure 5F:
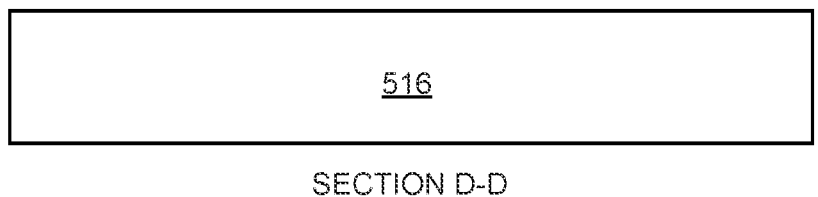
Figure 5G:
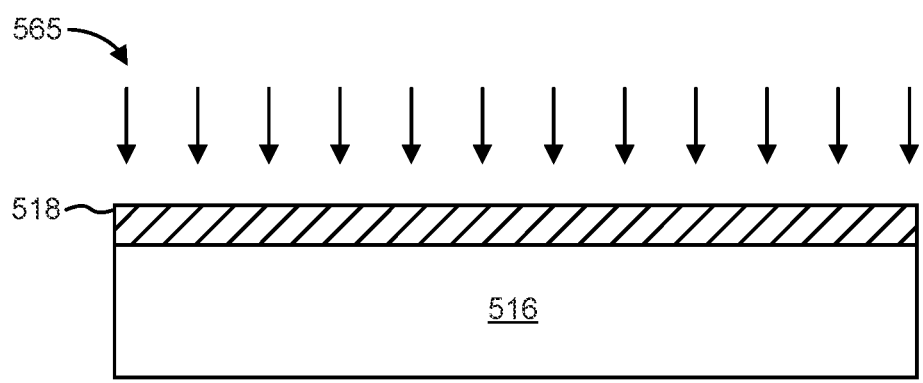
Figure 5H:
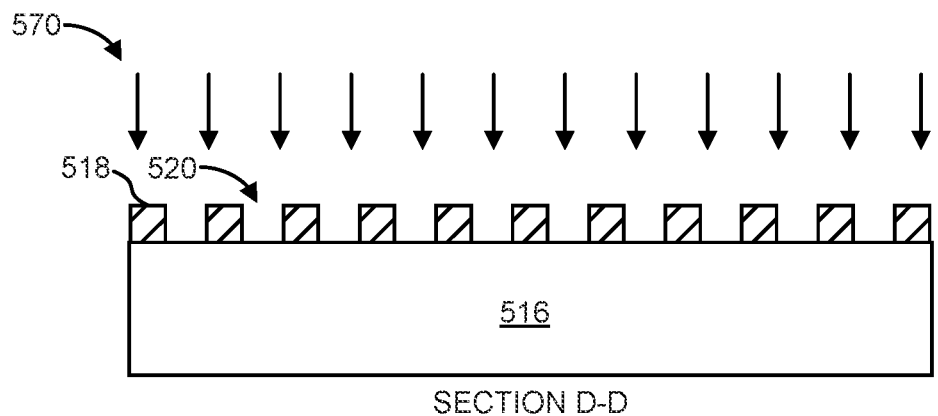
Figure 5I:
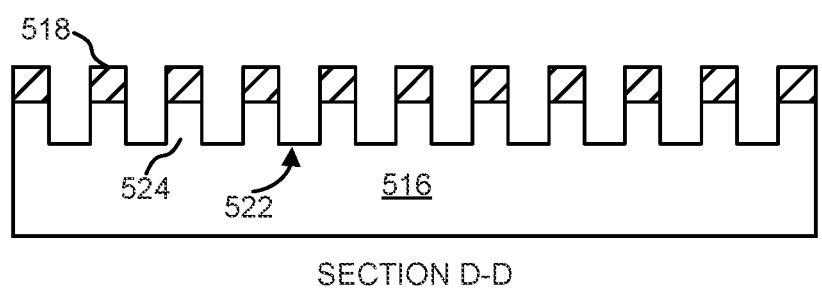
Figure 5J:
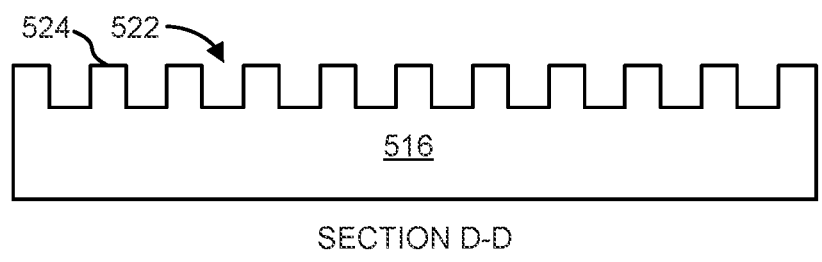
Figure 5K:
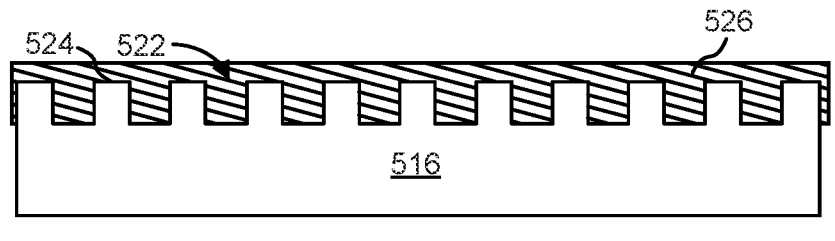
Figure 5L:
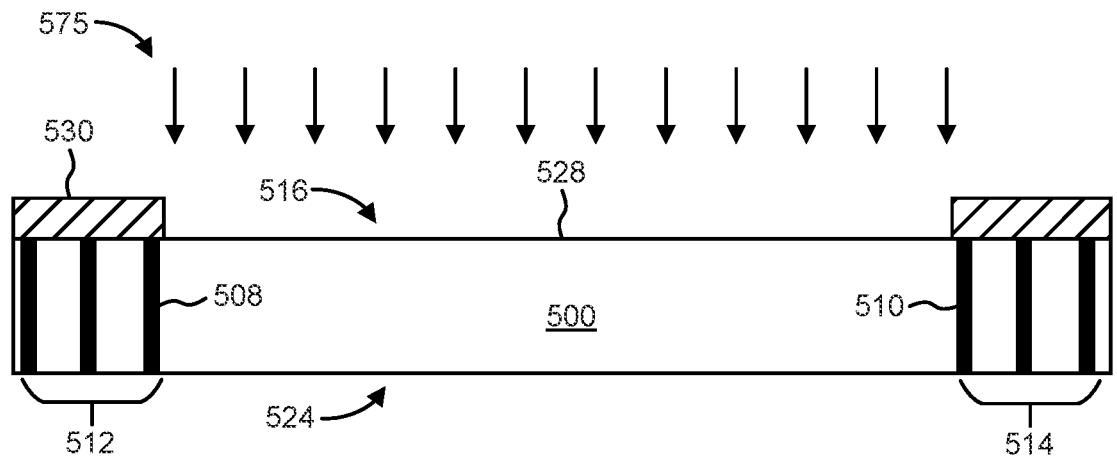
Figure 5M:
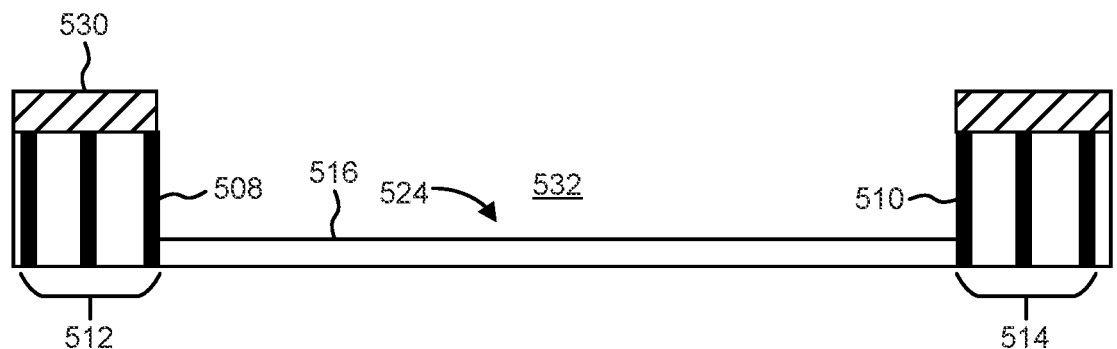
Figure 5N:
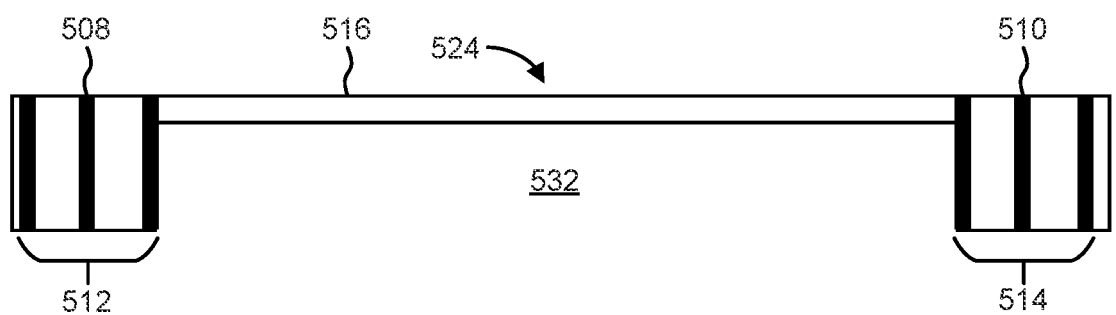

FIGS. 5A-5N illustrate an example of a fabrication process of the electrical connection device 200 illustrated in FIG. 2A formed from a single piece (e.g., sheet or block) of material (e.g., silicon, sapphire, quartz, polyimide). Though depicted sequentially as a matter of convenience, at least some of the actions shown can be performed in a different order and/or performed in parallel. Alternatively, some implementations may perform only some of the actions shown. Still further, although the example illustrated in FIGS. 5A-5N is an example method illustrating the example configuration of connector section of FIG. 2A, other methods and configurations are possible.

Referring first to FIGS. 5A-5E, FIGS. 5A-5E illustrate a fabrication process to fabricate the electrical contacts 208, 209 in the first and second electrical connectors 202, 204 of the electrical connection device 200 illustrated in FIG. 2A. Referring to FIG. 5A, the fabricating process begins with a single piece (e.g., sheet or block) of material (e.g., silicon, sapphire, quartz, polyimide) 500 having a thickness of approximately 50-1000 microns. Although, not illustrated in the fabrication process of FIGS. 5A-5N for simplicity, the metal traces 214 are deposited via sputtering, evaporation, plating, etc. in or on a surface of the single piece of material 500.

A first photoresist material layer 502 is deposited on a surface of the flexible material 500, as illustrated in FIG. 5B. The first photoresist material layer 502 is patterned and developed 550 to expose openings 504 in the first photoresist material layer 502, thereby exposing portions of the surface near each end of the single piece of material 500 resulting in the configuration in FIG. 5C. The first photoresist material layer 502 can have a thickness that varies in correspondence with the wavelength of radiation used to pattern the first photoresist material layer 502. The photoresist first material layer 502 may be formed via spin-coating or spin casting deposition techniques, selectively irradiated (e.g., via deep ultraviolet (DUV) irradiation) and developed to form the openings 504. The configuration in FIG. 5C undergoes a first etching process (e.g., deep reactive ion etching) 555 to fully etch the exposed portions of the single piece of material 500 thereby forming vias 506 near the ends of the single piece of material 500 resulting in the configuration of FIG. 5D. The first photoresist material layer 502 is stripped and the vias 506 are filled via a deposition process with an electrically conductive material (e.g. gold, copper, aluminum) to form first and second electrical contacts 508, 510 respectively resulting in the configuration in FIG. 5E. The configuration in FIG. 5E includes first and second electrical connectors 512, 514 and a connector section 516.

FIGS. 5F-5K are cross-sectional views taken along line D-D to the line L of the configuration in FIG. 5E and illustrate a fabrication process for fabricating the connector section 206 and the flexible strands 210 illustrated in FIG. 2A. Referring to FIG. 5F, a second photoresist material layer 518 is deposited on the surface of the connector section 516 resulting in the configuration of FIG. 5G. The second photoresist material layer 518 is patterned and developed 565 to expose openings 520 in the second photoresist material layer 518, thereby exposing portions of the connector section 516 within the openings 520 resulting in the configuration of FIG. 5H. The second photoresist material layer 518 can have a thickness that varies in correspondence with the wavelength of radiation used to pattern the second photoresist material layer 518. The second photoresist material layer 518 may be formed over the connector section 516 via spin-coating or spin casting deposition techniques, selectively irradiated (e.g., via deep ultraviolet (DUV) irradiation) and developed to form the openings 520.

The configuration in FIG. 5H undergoes a second etching process (e.g., deep reactive ion etching) 570 to partially etch the exposed portions of the connector section 516 thereby forming slots 522 and strands 524 in the connector section 516 resulting in the configuration of FIG. 5I. The second photoresist material layer 518 is stripped resulting in the connector section 516 illustrated in FIG. 5J prior to etching the remainder of the connector section 516. Referring to FIG. 5K, as an optional process, a flexible polymer dielectric coating 526 may be applied over all or a portion of the strands 524 and in the slots 522 defined between the strands 524. The polymer dielectric coating 526 provides support for handling without sacrificing flexibility in both the y- and z-directions.

FIGS. 5L-5N illustrate an example fabrication process for fabricating the final electrical connection device 200 illustrated in FIG. 2A after fabrication of the strands 524 in the connector section 516. In this process, a third etching process 575 is performed on a backside 528 of the connector section 516 as described in U.S. Pat. No. 10,681,812, the entirety of which is herein incorporated by reference, to thereby release the previously formed strands 524. Specifically, the configuration in FIG. 5M has been rotated 180° so that the strands 524 are located on an opposite side of the backside etch process. A third photoresist material layer 530 is deposited on a surface of both the first and second electrical connectors 512, 514, as illustrated in FIG. 5L. The configuration in FIG. 5L undergoes the third etching process (e.g., deep reactive ion etching) 575 to partially etch an exposed portion of the single piece of material 500, more specifically, to partially etch an exposed portion of the connector section 516, thereby forming an opening 532 resulting in the configuration of FIG. 5M. After the third etching process 575, the slots 522 extend through the connector section 516 thereby releasing the strands 524 resulting in the electrical connection device 200 illustrated in FIGS. 2A and 2B. The third photoresist material layer 530 is stripped and the configuration is again rotated 180° resulting in the configuration in FIG. 5N. In the final product, the connector section 516 is comprised of individual strands 524 fabricated from a thin uniform sheet of flexible material (e.g., silicon, sapphire, quartz, polyimide) and has a thickness of approximately 10-50 microns.

FIGS. 6A-6H illustrate another example fabricating process for fabricating the flexible strands 310 of the connector section 306 illustrated in FIGS. 3A and 3B, where the connector section 306 includes the support structure 316A, 316B. The process to fabricate the electrical connectors and contacts is similar to the process described above relating to FIGS. 5A-5E and 5M-5N and will not be repeated. Though depicted sequentially as a matter of convenience, at least some of the actions shown can be performed in a different order and/or performed in parallel. Alternatively, some implementations may perform only some of the actions shown. Still further, although the example illustrated in FIGS. 6A-6H is an example method illustrating the example configuration of FIGS. 3A and 3B, other methods and configurations are possible.

Figure 6A:
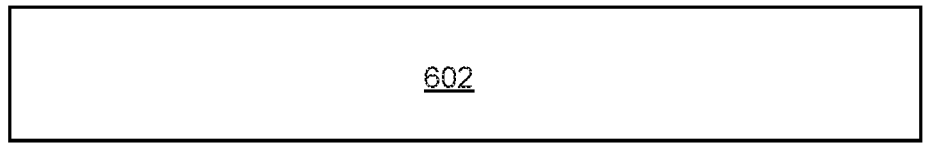
FIGS. 6A-6H is an example fabrication process of a connector section of the electrical connection device of FIGS. 3A and 3B.
Figure 6B:
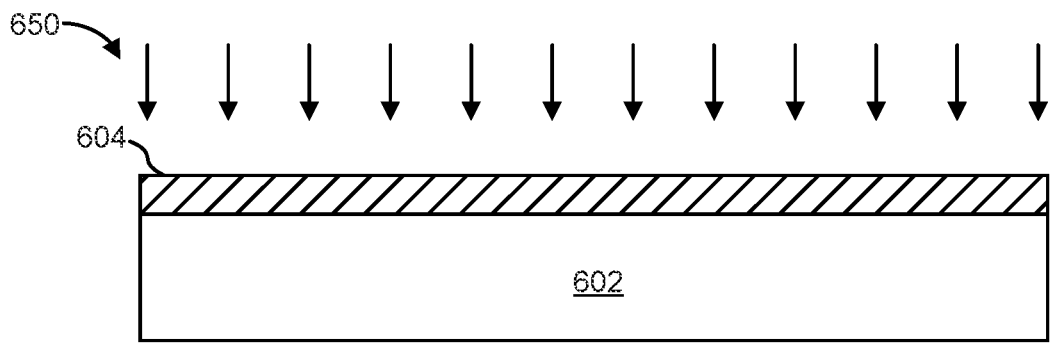

Referring to FIG. 6A, a connector section 602 is provided and includes metal traces (not shown in this process for simplicity) deposited in or on a surface of the connector section 602 via a sputtering, evaporation, plating, etc. process. A second photoresist material layer 604 is deposited on a surface of the connector section 602, see FIG. 6B. A portion of the second photoresist material layer 604 is patterned and developed 650 to expose openings 606 in the second photoresist material layer 604, thereby exposing portions of a top surface of the connector section 602 within the openings 606, see FIG. 6C. Another undeveloped portion 608 of the second photoresist material layer 604, however, is not developed in an area 610 of the connector section 602 where a support structure will be formed, see FIG. 6D. The second photoresist material layer 604 can have a thickness that varies in correspondence with the wavelength of radiation used to pattern the second photoresist material layer 604. The second photoresist material layer 604 may be formed over the connector section 602 via spin-coating or spin casting deposition techniques, selectively irradiated (e.g., via deep ultraviolet (DUV) irradiation) and developed to form the openings 606.

Figure 6C:
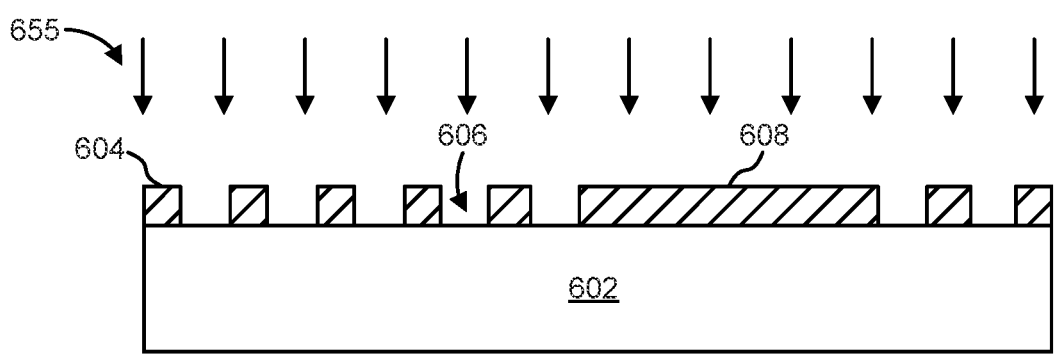
Figure 6D:
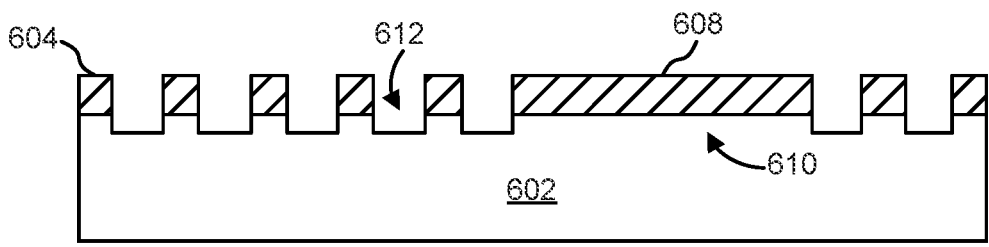
Figure 6E:
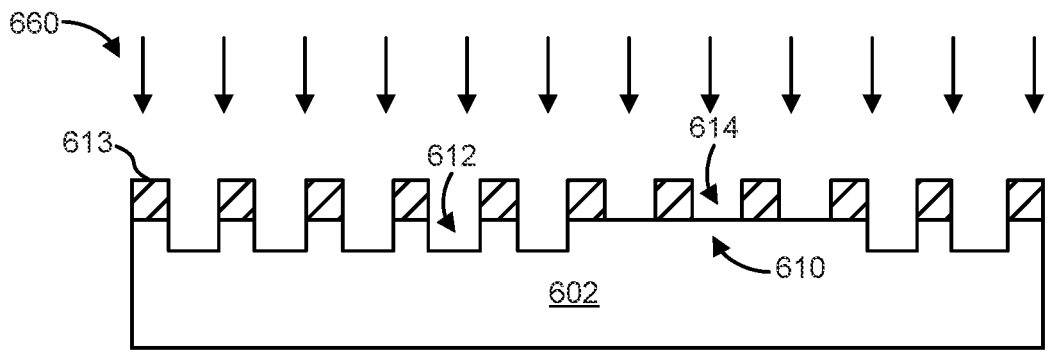
Figure 6F:
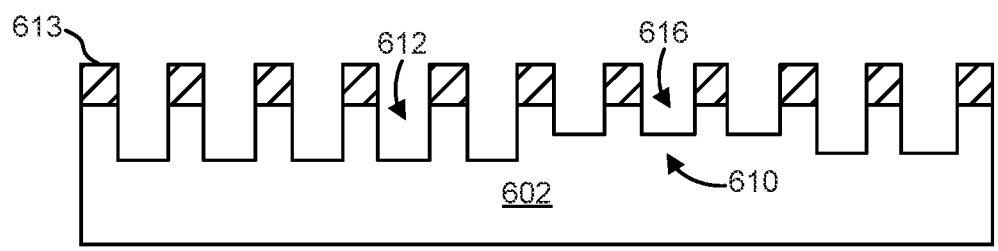
Figure 6G:
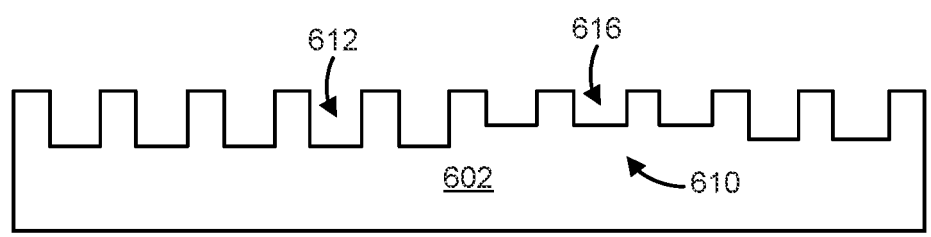
Figure 6H:
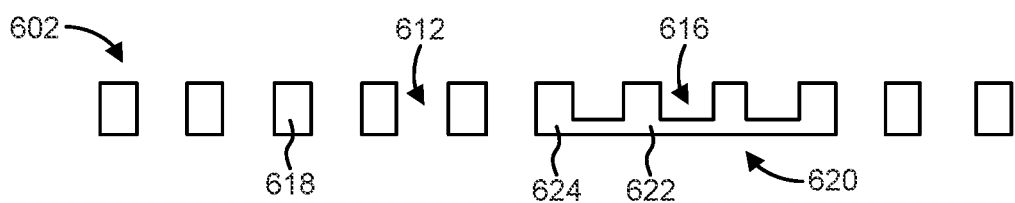

The configuration in FIG. 6C undergoes a partial etching (second) process (e.g., deep reactive ion etching) 655 to partially etch slots 612 approximately 2-5 microns into the exposed portions of the connector section 602 resulting in the configuration of FIG. 6D. The second photoresist layer 604 is removed and a third photoresist layer 613 is deposited on a surface and patterned to form openings 614 resulting in the configuration of FIG. 6E. The configuration of FIG. 6E undergoes a third etching process (e.g. deep reactive ion etching) 660 of approximately another 15-18 microns to deepen the slots 612 and to partially etch openings or channels 616 in the connector section 602 in the area 610 where the support structure will be formed resulting in the configuration of FIG. 6F. The second photoresist material layer 604 is stripped resulting in the configuration of FIG. 6G.

As described above, an etching (fourth) process is performed on a backside of the connector section 602 to thereby form and release strands 618 where the slots 612 are defined between the strands 618. In addition, one or more support structures 620 can be formed where each support structure 620 includes a base 622 and integrated strands 624 having the channels 616 defined between the integrated strands 624 thereby forming the connector section 602 in FIG. 6H.

The connector section 602 is fabricated from a thin uniform sheet of flexible material (e.g., silicon, sapphire, quartz, polyimide) and has a thickness of approximately 10-50 microns. The base 622 of the support structure(s) 620 is comprised of an ultrathin layer (e.g., 1-10 microns) of the uniform sheet of flexible material of the connector section 602 and provides additional rigidity and mechanical support for handling without sacrificing flexibility in the y- and z-direction. As mentioned above, for an example uniform sheet of flexible material having a thickness of 20 microns, the one or more support structures will have a resulting thickness of approximately 2-5 microns. Thus, a thickness of the flexible strands in the portion of the support structure will then have a thickness of approximately 15-18 microns.

As an optional process, the polymer dielectric coating 526 illustrated in FIG. 5L may be applied over all or a portion of the flexible strands 618, 624 and in the slots 612 and channels 616 between the flexible strands 618, 624. The combination of the support structure 620 and the polymer dielectric coating 526 provides support for handling without sacrificing flexibility in both the y- and z-directions.

FIGS. 7A-7M illustrate another example fabricating process for fabricating the flexible strands 310 of the connector section 306 illustrated in FIGS. 3A-3C, where the connector section 306 includes the support structure 316A, 316B. The process to fabricate the first and second electrical connectors and contacts is similar to the process described above relating to FIGS. 5A-5E and 5M-5N and will not be repeated. Though depicted sequentially as a matter of convenience, at least some of the actions shown can be performed in a different order and/or performed in parallel. Alternatively, some implementations may perform only some of the actions shown. Still further, although the example illustrated in FIGS. 7A-7M is an example method illustrating the example configuration of FIGS. 3A and 3B, other methods and configurations are possible.

Figure 7A:
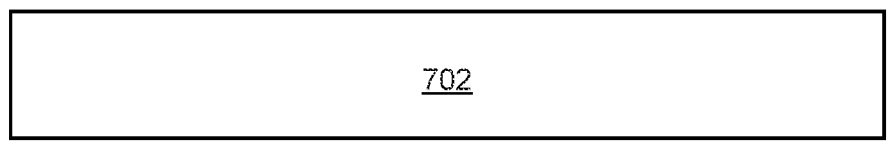
FIGS. 7A-7M is another example fabrication process of a connector section of the electrical connection device of FIGS. 3A and 3B.
Figure 7B:
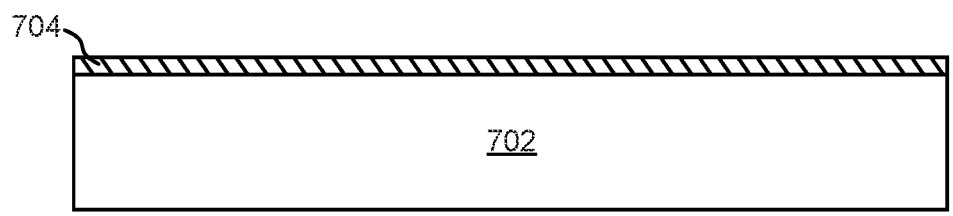
Figure 7C:
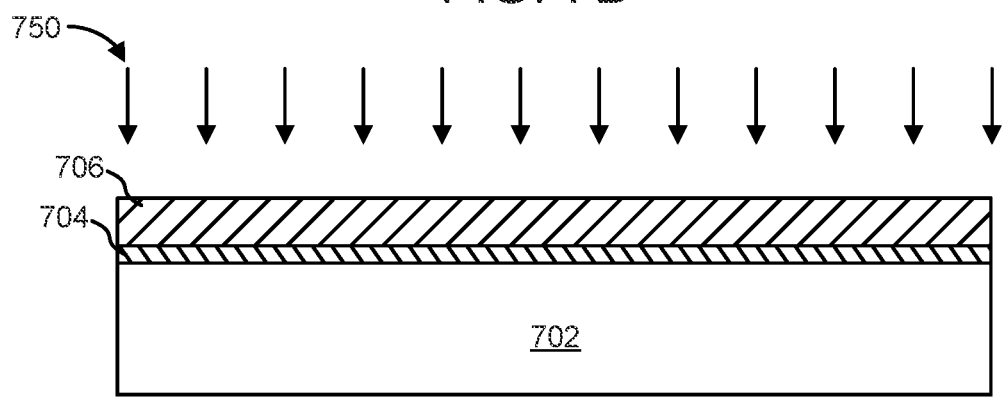
Figure 7D:
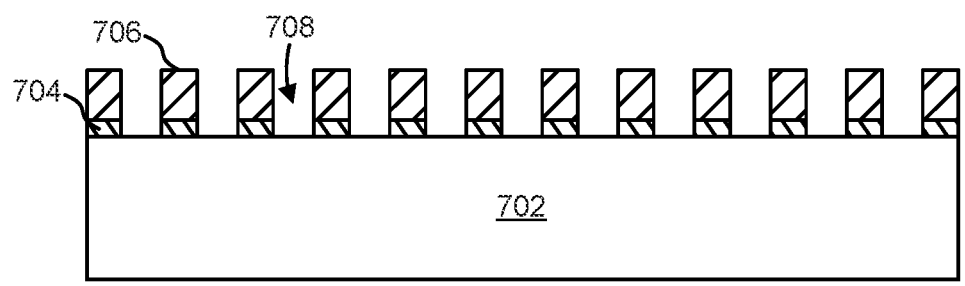
Figure 7E:
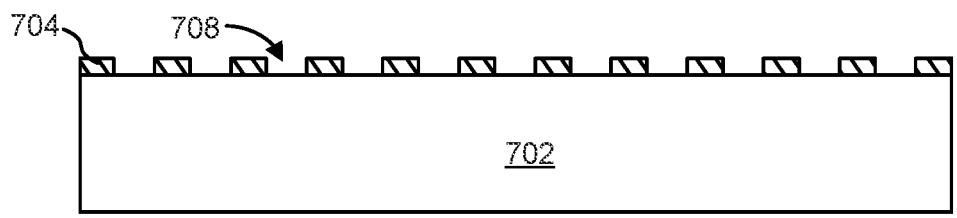

Referring to FIG. 7A, a connector section 702 is provided and includes metal traces (not shown in this process for simplicity) deposited in or on a surface of the connector section 702 via a sputtering, evaporation, plating, etc. process. A first metal (e.g., aluminum and/or tantalum) mask 704 is deposited on a surface of the connector section 702, see FIG. 7B. A second photoresist material layer 706 is deposited on a surface of the first metal mask 704, sec FIG. 7C. The combination of the first metal mask 704 and the second photoresist material layer 706 comprise a first mask layer. The second photoresist material layer 706 can have a thickness that varies in correspondence with the wavelength of radiation used to pattern the second photoresist material layer 706. The second photoresist material layer 706 is patterned and developed 750 and the first metal mask 704 is etched to create openings 708 thereby exposing portions of a top surface of the connector section 702 within the openings 708, see FIG. 7D. The second photoresist material layer 706 is stripped resulting in the configuration of FIG. 7E.

Figure 7F:
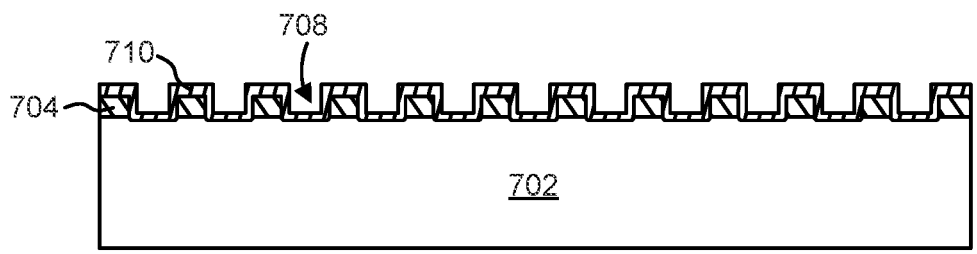
Figure 7G:
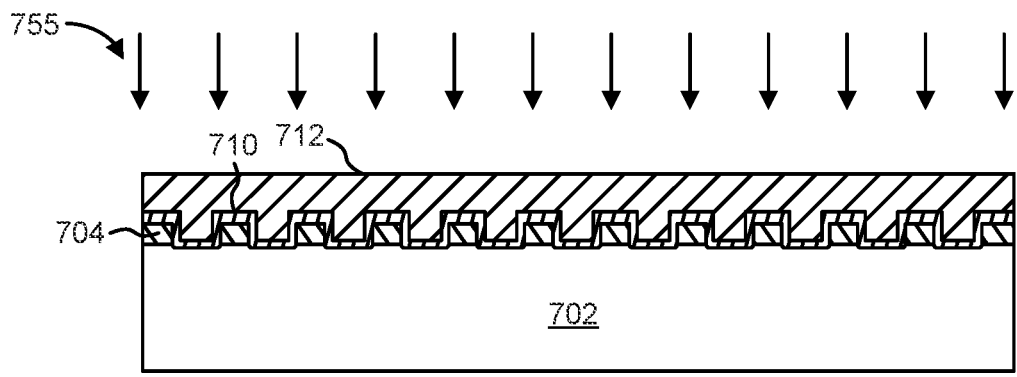
Figure 7H:
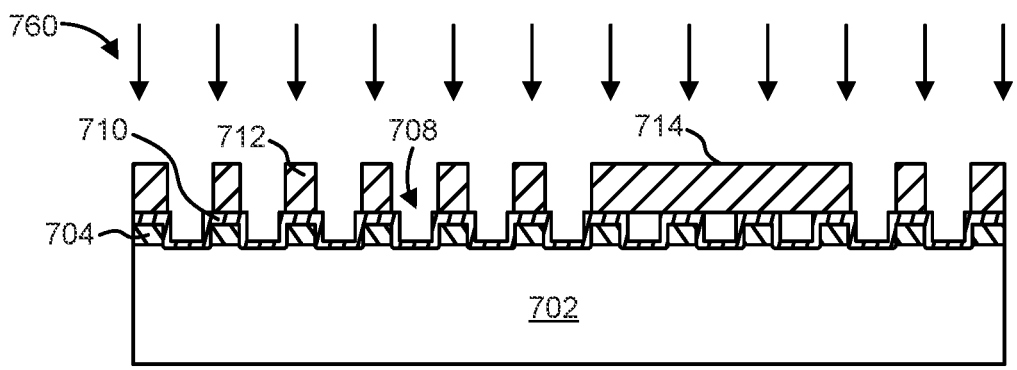
Figure 7I:
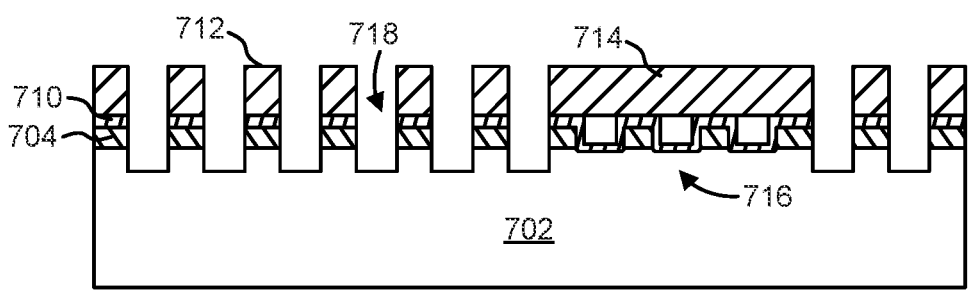

A second metal (e.g., aluminum) mask 710 is deposited on the remaining portions first metal mask 704 and on the exposed portions of the connector section 702, resulting in the configuration of FIG. 7F. A third photoresist material layer 712 is deposited on a surface of the second metal mask 710, see FIG. 7G. The combination of the second metal mask 710 and the third photoresist material layer 712 comprise a second mask layer. A portion of the third photoresist material layer 712 is patterned and developed 755 such that some remaining portions of the third photoresist material layer 712 are aligned with some remaining portions of the of the first metal mask 704, see FIG. 7H. Another undeveloped portion 714 of the third photoresist material layer 712, however, is not developed in an area 716 of the connector section 702 where a support structure will be formed, see FIGS. 7H and 7I. The configuration of FIG. 7H undergoes a second etching process (e.g., deep reactive ion etching) 760 to remove exposed portions of the second metal mask 710 and to partially etch slots 718 into the connector section 702 resulting in the configuration of FIG. 7I. The third photoresist material layer 712 is removed resulting in the configuration in FIG. 7J.

Figure 7J:
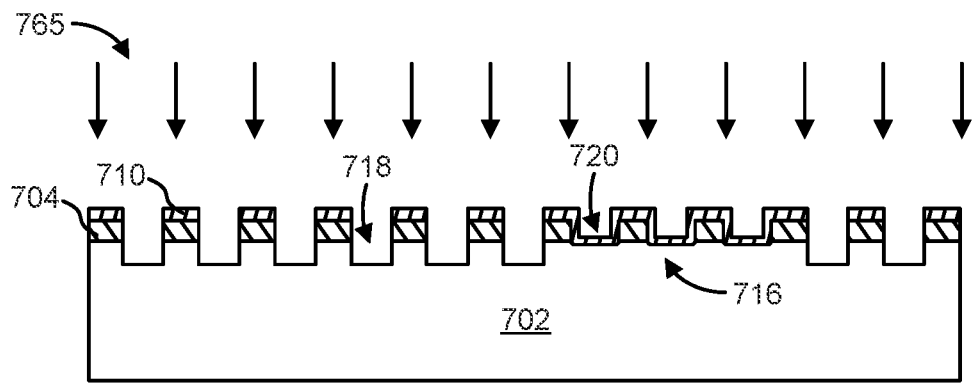
Figure 7K:
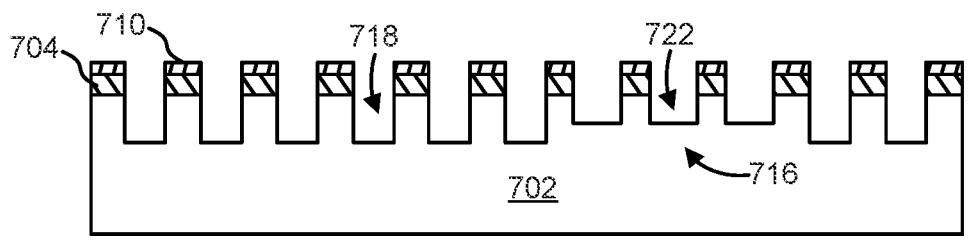
Figure 7L:
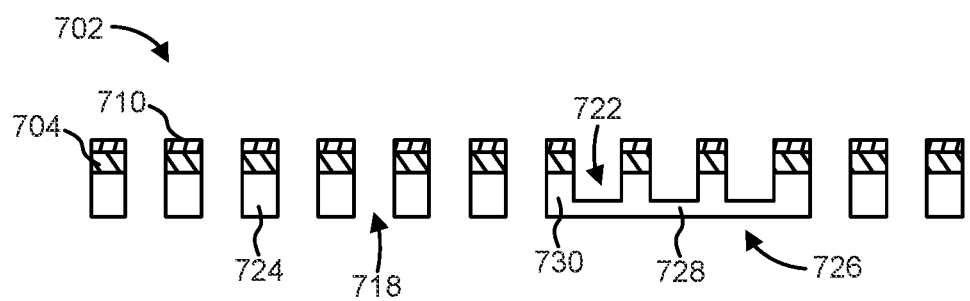

The configuration of FIG. 7J undergoes a third etching process (e.g. deep reactive ion etching) 765 of approximately another 15-18 microns to deepen the slots 718 and to partially etch openings or channels 722 in the connector section 702 in an area 716 where the support structure will be formed resulting in the configuration of FIG. 7K. As described above, an etching (fourth) process is performed on a backside of the connector section 702 to thereby form and release strands 724 where the slots 718 are defined between the strands 724. In addition, one or more support structures 726 can be formed where each support structure 726 includes a base 728 and integrated strands 730 having the channels 722 defined between the integrated strands 730 thereby forming the connector section 702 in FIG. 7L.

Figure 7M:
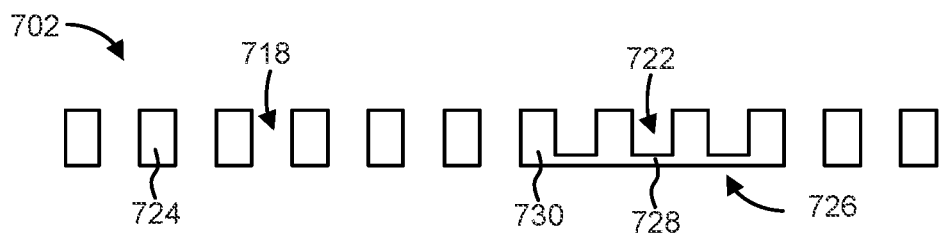

As an optional process step, it is not necessary, but the first and second metal masks 704, 710 can be stripped via an etching process resulting in the connector section 702 of FIG. 7M. The connector section 702 in FIG. 7M includes the strands 724 and the slots 718 defined between the strands 724, and the support structure 726 that includes the base 728 and the integrated strands 730 having the channels 722 defined between the integrated strands 730.

The connector section 702 is fabricated from a thin uniform sheet of flexible material (e.g., silicon, sapphire, quartz, polyimide) and has a thickness of approximately 10-50 microns. The base 728 of the support structure(s) 726 are comprised of an ultrathin layer (e.g., 1-10 microns) of the uniform sheet of flexible material of the connector section 702 and provides additional rigidity and mechanical support for handling without sacrificing flexibility in the y- and z-direction. As mentioned above, for an example uniform sheet of flexible material having a thickness of 20 microns, the one or more support structures will have a resulting thickness of approximately 2-5 microns. Thus, a thickness of the flexible strands in the portion of the support structure will then have a thickness of approximately 15-18 microns.

As an optional process, prior to the backside etching process, the polymer dielectric coating 526 illustrated in FIG. 5L may be applied over all or a portion of the flexible strands 724, 730 and in the slots 718 and channels 722 between the flexible strands 724, 730. The combination of the support structure 726 and the polymer dielectric coating 526 provides support for handling without sacrificing flexibility in both the y- and z-directions.

The improved flexible electrical connection device improves the flexibility of the connection device in several directions with the addition of etching slots into a connector section of the connection device to form flexible strands. Varying the thickness of the flexible strands further increases the flexibility. Increasing the flexibility reduces the risk of failure due to handling and twisting. In addition, forming the slots by an etching process reduces the risks associated with defects along edges of the flexible strands. Still further, incorporating ultra-thin support structures and/or adding a flexible polymer dielectric coating over the flexible strands improves the overall rigidity and strength of the connection device without sacrificing flexibility.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. An electrical connection device comprising:
    a first electrical connector having first electrical contacts formed therein;
    a second electrical connector having second electrical contacts formed therein; and
    a flexible silicon connector section connecting the first electrical connector and the second electrical connector, the connector section comprising flexible strands separated by slots, the flexible strands being flexible in directions orthogonal to a longitudinal direction of the connector section, the flexible strands including metal traces deposited therein to provide an electrical connection between the first electrical connector and the second electrical connector.

2. The electrical connection device of claim 1, wherein the first electrical connector and the second electrical connector are formed from silicon, and wherein the first electrical connector, the second electrical connector, and the flexible silicon connector section are formed from a single piece of flexible silicon material.

3. The electrical connection device of claim 1 further comprising a flexible coating over the flexible silicon connector section, wherein the flexible coating covers the flexible strands and fills the slots defined between the flexible strands.

4. The electrical connection device of claim 1, wherein the flexible silicon connector section includes at least one support structure integrated with a surface in one or more regions of the flexible strands, the at least one support structure extending across a total width of the flexible silicon connector section.

5. The electrical connection device of claim 4, wherein the at least one support structure extends across a total length of the flexible silicon connector section.

6. The electrical connection device of claim 5, wherein the at least one support structure includes a base and strands integrated with the base and wherein channels are defined between the integrated strands.

7. The electrical connection device of claim 6 further comprising a flexible coating over the flexible silicon connector section, wherein the flexible coating covers the support structure, the flexible strands, and fills the slots defined between the flexible strands.

8. A method comprising:
 providing a single piece of silicon material having metal traces disposed therein;
 depositing an electrically conductive material in vias formed in each end of the single piece of silicon material via a first etching process to form contacts that connect with the metal traces;
 forming slots in a connector section of the single piece of silicon material via a second etching process, the slots being defined between strands of the connector section; and
 etching via a third etching process a backside of an exposed portion of the connector section of the single piece of silicon material to form an opening such that the slots extend through the connector section to thereby release the strands.

9. The method of claim 8 further comprising applying a flexible coating to the connector section, the flexible coating covering the strands and being deposited in the slots defined between the strands.

10. The method of claim 8, wherein prior to depositing an electrically conductive material in vias formed in each end of the single piece of silicon material via a first etching process to form contacts that connect with the metal traces, the method comprising:
 depositing a first photoresist material layer on a surface of the single piece of silicon material;
 patterning the first photoresist material layer to form openings in the first photoresist material layer thereby creating exposed portions at each end of the single piece of silicon material;
 fully etching the exposed portions of the single piece of silicon material to form vias in the ends of the single piece of silicon material; and
 stripping the first photoresist material layer.

11. The method of claim 10, wherein prior to forming slots in a connector section of the single piece of silicon material via a second etching process, the slots being defined between strands of the connector section, the method comprising:
 depositing a second photoresist material layer on a surface of a connector section of the single piece of silicon material;
 patterning the second photoresist material layer to form openings in the second photoresist material layer thereby creating exposed portions of the connector section of the single piece of silicon material;
 partially etching the exposed portions of the single piece of silicon material in the silicon connector section of the single piece of silicon material to form the slots and the strands; and
 stripping the second photoresist material layer.

12. The method of claim 11, wherein etching via a third etching process a backside of an exposed portion of the connector section of the single piece of silicon material to form an opening such that the slots extend through the connector section to thereby release the strands comprises:
 depositing a third photoresist material layer on a backside surface of each end of the single piece of silicon material; and
 patterning the third photoresist material layer to form an opening in the third photoresist material layer thereby exposing the exposed portion of the connector section of the single piece of silicon material.

13. The method of claim 12 further comprising applying a flexible coating to the connector section, the flexible coating covering the strands and being deposited in the slots defined between the strands.

14. A method comprising:
 providing a single piece of silicon material having metal traces disposed therein;
 depositing an electrically conductive material in vias formed in each end of the single piece of silicon material via a first etching process to form contacts that connect with the metal traces;
 forming slots in a portion of a connector section of the single piece of silicon material via a second etching process, the slots being defined between strands of the connector section;
 forming channels and integrated strands in a support structure area of the connector section via a third etching process, the channels being formed between the integrated strands; and
 etching via a fourth etching process a backside of an exposed portion of the connector section of the single piece of silicon material to form an opening such that the slots extend through the connector section to thereby release the strands and to form a support structure, the support structure comprised a base and the integrated strands attached to the base in the support structure area of the connector section.

15. The method of claim 14, wherein prior to depositing an electrically conductive material in vias formed in each end of the single piece of silicon material via a first etching process to form contacts that connect with the metal traces, the method comprising:
 depositing a first photoresist material layer on a surface of the single piece of silicon material;
 patterning the first photoresist material layer to form openings in the first photoresist material layer thereby creating exposed portions at each end of the single piece of silicon material;
 fully etching the exposed portions of the single piece of silicon material to form vias in the ends of the single piece of silicon material; and
 stripping the first photoresist material layer.

16. The method of claim 15, wherein prior to forming slots and strands in a connector section of the single piece of silicon material via a second etching process, the method comprising:

depositing a second photoresist material layer on a surface of a connector section of the single piece of silicon material;

patterning the second photoresist material layer to form openings in the second photoresist material layer thereby creating exposed portions of the connector section of the single piece of silicon material;

partially etching the exposed portions of the single piece of silicon material in the silicon connector section of the single piece of silicon material to form the slots and the strands; and stripping the second photoresist material layer.

17. The method of claim 16, wherein etching via a fourth etching process a backside of an exposed portion of the connector section of the single piece of silicon material to form an opening such that the slots extend through the connector section to thereby release the strands and to form a support structure, the support structure comprised a base and the integrated strands attached to the base in the support structure area of the connector section further comprises:

depositing a third photoresist material layer on a backside surface of the single piece of silicon material;

patterning the third photoresist material layer to form an opening in the third photoresist material layer thereby exposing the exposed portion of the connector section of the single piece of silicon material; and partially etching the backside of the exposed portion of the connector section.

18. The method of claim 14 further comprising applying a flexible coating to the connector section, the flexible coating covering the strands and being deposited in the slots defined between the strands and covering the integrated strands and being deposited in the channels defined between the integrated strands.

19. The method of claim 14, wherein prior to depositing an electrically conductive material in vias formed in each end of the single piece of silicon material via a first etching process to form contacts that connect with the metal traces, the method comprising:

depositing a first metal mask on a surface of the single piece of silicon material; and depositing a second metal mask on a surface of the first metal mask.

20. The method of claim 19 further comprising applying a flexible coating to the connector section, the flexible coating covering the first and second metal masks, covering the strands and being deposited in the slots defined between the strands, and covering the integrated strands and being deposited in the channels defined between the integrated strands.

* * * * *